United States Patent [19]
Avanic et al.

[11] Patent Number: 5,650,755
[45] Date of Patent: Jul. 22, 1997

[54] VOLTAGE CONTROLLED OSCILLATOR MODULE ASSEMBLY

[75] Inventors: Branko Avanic, Miami; Anthony J. Suppelsa, Coral Springs; David C. Everest, III, Tamarac, all of Fla.

[73] Assignee: Motorola, Inc., Schaumburg, Ill.

[21] Appl. No.: 617,249

[22] Filed: Mar. 18, 1996

[51] Int. Cl.$^6$ ..................................... H03B 1/00
[52] U.S. Cl. ........................... 331/67; 331/68; 257/708; 361/743; 361/799; 361/810
[58] Field of Search ................ 331/68, 67; 257/708, 257/728, 730; 361/743, 752, 753, 799, 800, 810, 816

[56] References Cited

U.S. PATENT DOCUMENTS 4,338,576  7/1982  Takahashi et al. ..................... 331/67
5,373,262  12/1994  Yamamoto et al. ..................... 331/67

*Primary Examiner*—Siegfried H. Grimm
*Attorney, Agent, or Firm*—Barbara R. Doutre

[57] ABSTRACT

A voltage controlled oscillator module assembly (300) minimizes microphonics in a low profile package. Included within the module (300) are a substrate (302), VCO circuitry (308), and a ground shield (314) encapsulating the VCO circuitry. Included within the VCO circuitry (308) is at least one resonator (310) which is solderable on at least two of its surfaces. One surface of the resonator (310) is soldered to the substrate (302) while another surface of the resonator is soldered to the shield (314). An improved ground is thus provided to the resonator (310) which reduces the occurrences of microphonics while providing a low profile package for the module (300).

11 Claims, 3 Drawing Sheets

VOLTAGE CONTROLLED OSCILLATOR MODULE ASSEMBLY

TECHNICAL FIELD

This invention relates in general to voltage controlled oscillators and more specifically to the packaging of surface mount voltage controlled oscillators.

BACKGROUND

With today's portable communication products becoming smaller and more compact, the designs for these products, from both an electrical and mechanical perspective, are moving towards miniaturization. The miniaturization of both electrical and mechanical components to accommodate limited space constraints has lead to an increase in issues relating to radio performance. One such issue is the occurrence of microphonics associated with voltage controlled oscillator (VCO) circuits.

Voltage controlled oscillator circuits provide the operating frequencies with which communications products transmit or receive signals. In portable radio applications, a voltage controlled oscillator typically consists of a module formed from a substrate upon which a tank circuit including a resonator is provided. The noise performance specifications associated with the VCO module are critical to the performance of the radio. A VCO module is typically shielded with a metalized can to isolate the tank circuit and maintain the stability of the frequency within the radio. Because of space restrictions, however, the shield may violate the height required to minimize field perturbations within the VCO module. Any disturbances in the tightly coupled fields of the VCO module can degrade the noise performance of the VCO and thus the radio.

Microphonic problems in radio products are associated with both mechanical and electrical limitations imposed by product size, manufacturing processes, and packaging capabilities. In the case of the VCO module, a tightly constrained metalized can tends to behave as a membrane, coupling acoustical energy into mechanical vibrations which in turn modulate the fields of the oscillator. This in turn can cause low frequency deviations to be channeled to the speaker in the form of unwanted audio signals. Depending on the severity of the vibrations, a closed loop can be formed where the radio exhibits a "howling" noise, a term commonly used for describing microphonics.

Accordingly, there is a need for an improved voltage controlled oscillator assembly which minimizes microphonics in radio communications products.

DETAILED DESCRIPTION OF THE PREFERRED EMBODIMENTS

Figure 1:
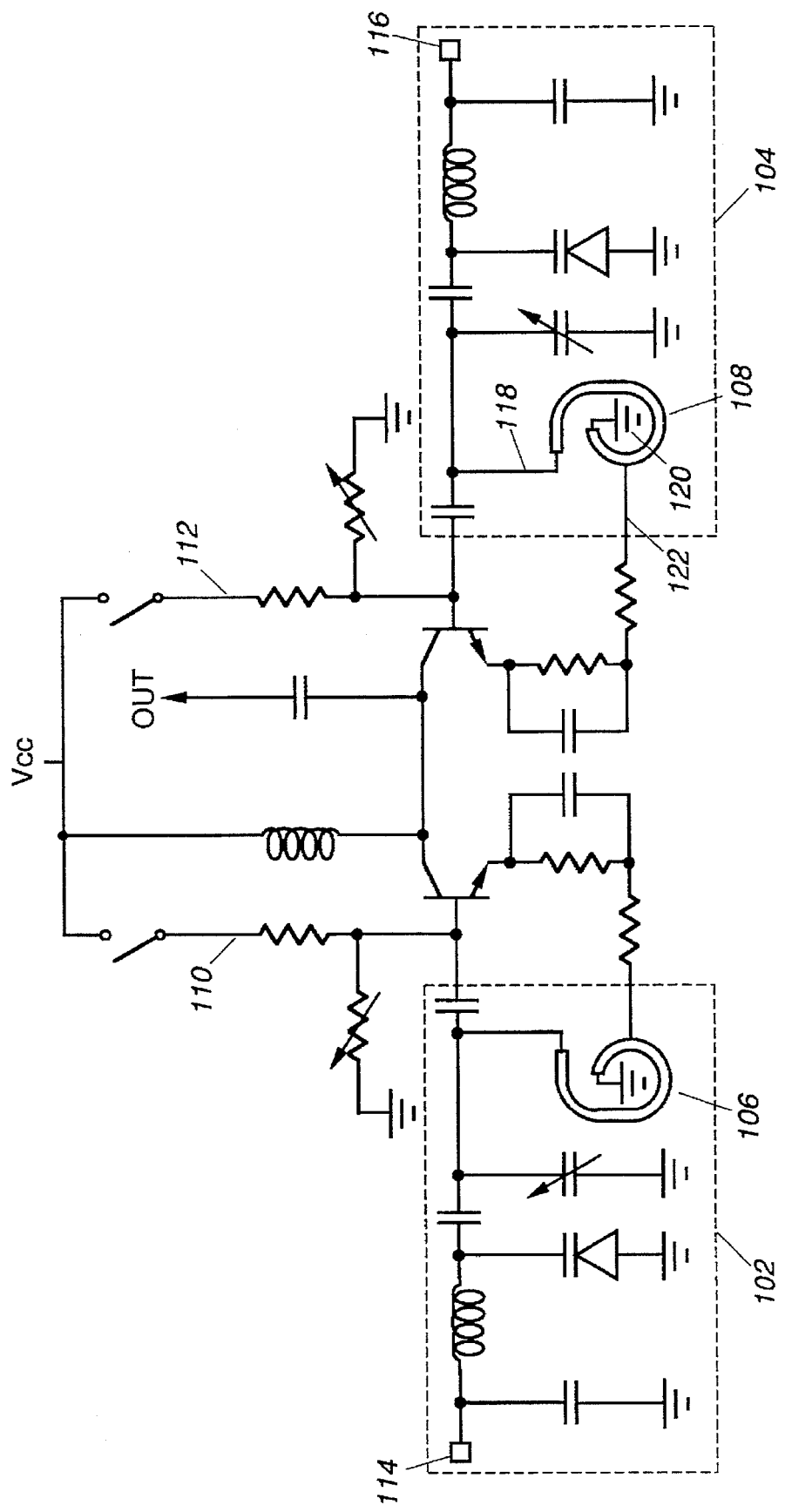
FIG. 1 is a prior art schematic of a dual Hartley voltage controlled oscillator.

The VCO module assembly of the present invention, to be described herein, minimizes microphonics in portable communication products. FIG. 1 of the accompanying drawings is a schematic diagram of a well known dual Hartley oscillator circuit 100, such as one used in radio communication products. The dual Hartley oscillator 100 includes first and second tank circuits 102, 104, each of which includes a resonator element 106, 108. The VCO module assembly of the present invention is especially useful in oscillator applications such as the dual Hartley oscillator, where two or more resonators are employed. The dual Hartley oscillator 100 supplies the two tank circuits 102, 104 through separate switched supply lines 110, 112 supplied by voltage supply, Vcc. The two tank circuits 102, 104 operate independently through control lines 114, 116 depending on which supply line 110 or 112 is switched on. Each resonator 106, 108 of each tank circuit 102, 104 preferably includes at least one input port 118, at least one ground port 120, and one or more tapped output port(s) 122.

Figure 2:
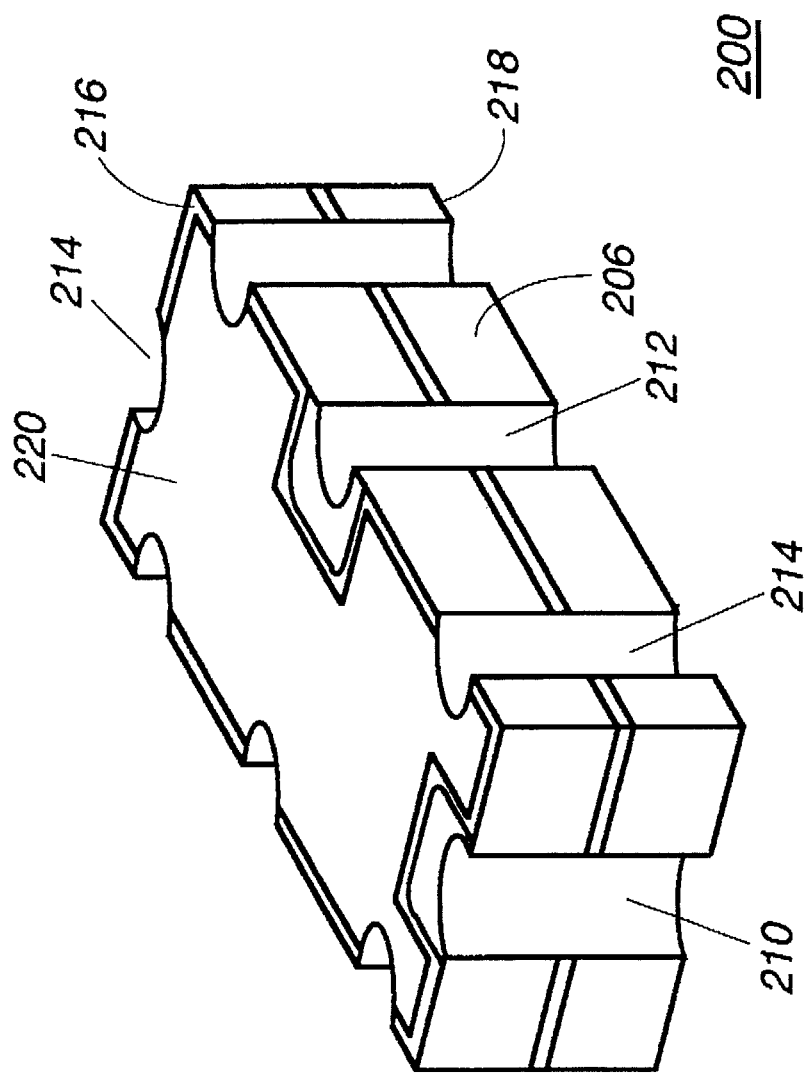
FIG. 2 is a prior art resonator.

FIG. 2 shows an example of a prior art resonator 200. Resonator 200 is a multi-layer structure including an input port 210, an output port 212, and at least one ground port(s) 214 extending between top and bottom surfaces 216, 218 of the resonator structure. Photo-resist is typically used to cover input and output ports 210, 212 on the top surface 216 of the component while the bottom surface 218 leaves these ports exposed to provide interconnects to a substrate. The ground port(s) 214 are typically used to couple a metalized plane disposed on the top surface 216 to a similar metalized plane 220 on the bottom surface 218. Vias (not shown) may also be used to interconnect the metalized plane 220 of the top surface 216 to the metalized plane of the bottom surface 218. The bottom surface 218 of the resonator becomes coupled to ground through the soldering of the ground port(s) 214 to a substrate ground, such as a printed circuit board ground in a radio. Thus, the vias and ground port(s) 214 can be used to couple the top surface of the resonator structure to the ground of a radio.

Unfortunately, in many of today's resonators, especially those fabricated of ceramics, only a few small via holes can be used to interconnect the plated top and bottom surfaces 216, 218 in order to prevent breakage of the ceramic. With very few ground vias, the resonator ground tends to behave as a radiator increasing problems with microphonics. Increasing the number of ground port(s) 214 is not desirable, because the plating of the ground port(s) along multi-layer ceramics is time consuming and incurs expensive processing costs. The VCO module assembly of the present invention to be shown and described in FIG. 3, improves the grounding about a resonator component, such as the component shown in FIG. 2, to minimize microphonics as well as provides a more rugged shield.

Figure 3:
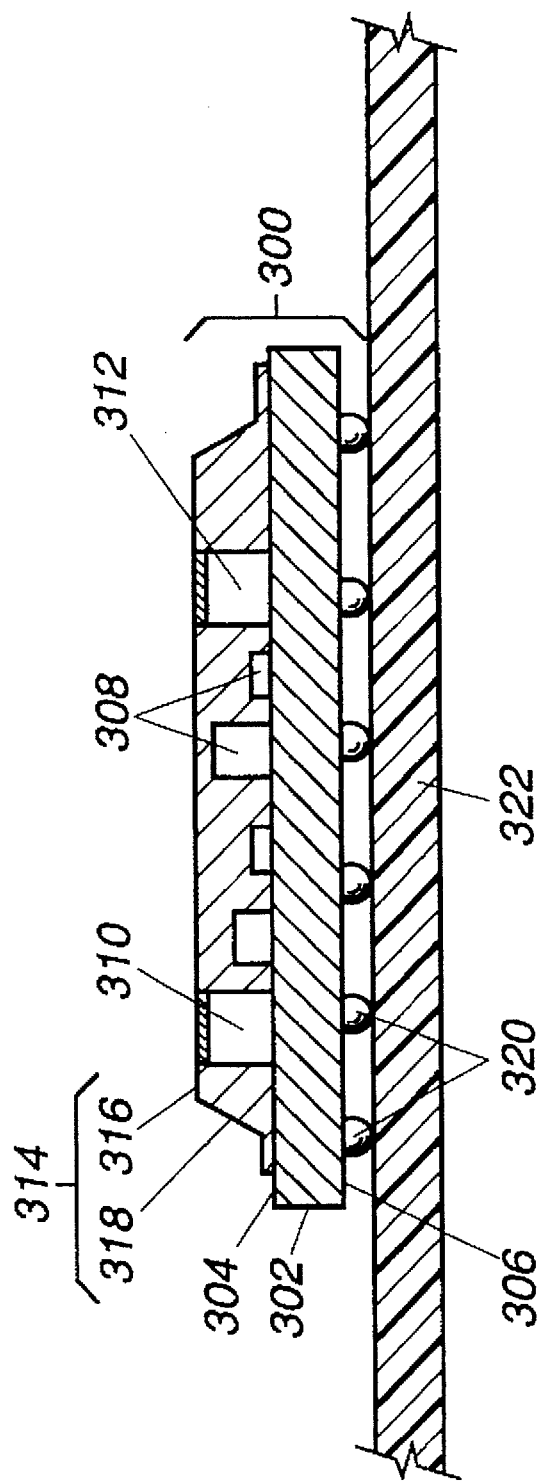
FIG. 3 is a cross sectional view of a voltage controlled oscillator (VCO) module assembly in accordance with the preferred embodiment of the invention.

FIG. 3 of the accompanying drawings shows a cross sectional view of a voltage controlled oscillator (VCO) module assembly 300 in accordance with the preferred embodiment of the invention. The VCO module assembly 300 includes substrate 302, such as a ceramic or printed circuit board substrate, having top and bottom surfaces 304, 306 respectively. Deposited upon the top surface 304 of substrate 302 are VCO components 308, including first and second resonators 310, 312 respectively. In accordance with the present invention, resonators 310, 312 are surface mountable components having solderable ground planes disposed on at least two outer surfaces of each resonator body.

Soldered onto the substrate 302 is ground shield 314 having a top surface 316 with sidewalls 318 extending therefrom. The sidewalls 318 of shield 314 are soldered onto the substrate ground so as to encapsulate and shield the VCO components 308 on the top surface 304 of the substrate 302. In accordance with the present invention, the VCO module assembly 300 provides an improved ground for the resonators 310, 312 by soldering one surface of each resonator to the substrate 302 and a second surface, here the top surface, of each resonator to the ground shield 314. This approach not only improves the ground about the resonators 310, 312 but provides for a more rugged shield as well.

By soldering the top metalized ground planes of the resonators 310, 312 to the shield 314 to improve the grounding, a very low profile package can now be achieved. The more rugged shield 314 has the advantage of being less susceptible to vibrations, and the resonators are less apt to behave as radiators due to their improved grounding, thus minimizing the occurrence of microphonics.

The VCO circuitry 308, including the resonator components 310, 312, is preferably placed onto the substrate 302 using well known automated pick-and-place techniques. The components are preferably reflowed onto the substrate at a first temperature using a high temperature solder while the shield is reflowed onto the substrate and the resonators at a second lower temperature using a lower temperature solder. Thus, the component placement will not be disturbed during the reflowing process of the shield. The VCO module 300 further includes leads or bumps 320 with which to attach the module to a circuit board, such as a radio board 322.

Resonators 310, 312 can take the form of a block resonator, stripline resonator, coaxial resonator, or any resonator which has metalized ground planes on at least two surfaces. For example, a coaxial resonator having leaded input and output ports extending from a metalized can could have one portion of the metalized can soldered to the ground of the substrate and another portion of the can soldered to the ground shield.

In summary, the VCO module assembly of the present invention comprises a substrate having VCO circuitry disposed thereon and including at least one resonator component having a metalized ground plane disposed about a predetermined portion of the resonator body. The metalized ground plane of the resonator body is soldered to the substrate and to the ground shield which is disposed about the VCO circuitry.

Accordingly, there has been provided a low profile VCO module assembly which minimizes the membrane effect associated with using a metal can in close proximity to the VCO components. While described with two resonator elements, one skilled in the art can appreciate that the module can be designed to accommodate a single resonator or a plurality of resonators depending on the radio application. The VCO module assembly of the present invention can accommodate various types of resonator elements, including transmission line resonators, microstrip resonator, stripline resonators, and coaxial resonators.

Soldering the shield of a VCO module to the resonator provides a good ground for the resonator as well as a rugged shield which is less susceptible to vibrations, thus providing a low profile VCO module which has a reduced potential of generating or incurring microphonics. The improved grounding provided by the VCO module described by the invention is achieved without the use of additional ground vias or ground ports to the resonator structure thus providing both cost and processing benefits as well.

Numerous modifications, changes, variations, substitutions, and equivalents will occur to those skilled in the art without departing from the spirit and scope of the present invention as defined by the appended claims.

What is claimed is:

1. A voltage controlled oscillator (VCO) module assembly, comprising:

a substrate having a ground plane;

VCO circuitry including at least one surface mount resonator component having first and second outer surfaces, the first outer surface being soldered to the substrate's ground plane; and a ground shield having a top surface and side walls extending therefrom, said top surface being soldered to the second outer surface of the at least one surface mount resonator component while said side walls are soldered to the substrate's ground plane.

2. A voltage controlled oscillator (VCO) module assembly, comprising:

a substrate;

VCO circuitry coupled to the substrate, said VCO circuitry including a first resonator component having first and second solderable surfaces, the first solderable surface being soldered to the substrate; and a ground shield coupled to the substrate and soldered to the second surface of the first resonator component.

3. A VCO module assembly as described in claim 1, further comprising a second resonator component having first and second solderable surfaces, the first solderable surface of the second resonator component being soldered to the substrate while the second solderable surface is soldered to the ground shield.

4. A VCO module assembly as described in claim 3, wherein the VCO circuitry provides a dual Hartley oscillator configuration.

5. A VCO module assembly as described in claim 3, wherein the first and second resonator components are soldered to the substrate using a first reflow temperature and the first and second resonator components are soldered to the ground shield using a second reflow temperature which is lower than the first reflow temperature.

6. A voltage controlled oscillator (VCO) module assembly, comprising:

a substrate;

VCO circuitry disposed on the substrate, said VCO circuitry including a resonator, said resonator comprising:

a resonator body having an input port and an output port; and a metalized ground plane disposed about a predetermined portion of the resonator body; and a ground shield disposed about the VCO circuitry on the substrate, said metalized ground plane of the resonator body being soldered to the substrate and to the ground shield.

7. A voltage controlled oscillator (VCO) module assembly, comprising:

a substrate;

VCO circuitry disposed on the substrate, said VCO circuitry including a resonator including first and second solderable ground surfaces, the second ground surface being soldered to the substrate; and a ground shield coupled to the substrate and soldered to the first ground surface of the resonator.

8. A VCO module assembly as described in claim 7, wherein the second ground surface of the resonator is soldered to the substrate using a first reflow temperature and the first ground surface of the resonator is soldered to the ground shield using a second reflow temperature which is lower than the first reflow temperature.

9. A VCO module assembly as described in claim 7, wherein the substrate comprises a ceramic material.

10. A VCO module assembly as described in claim 7, wherein the substrate comprises a printed circuit board.

11. A VCO module assembly as described in claim 7, wherein the resonator comprises a block resonator.

* * * * *